(12) United States Patent
Chung et al.

(10) Patent No.: US 9,606,211 B2
(45) Date of Patent: Mar. 28, 2017

(54) MAGNETIC RESONANCE IMAGING METHOD CANCELING ARTIFACTS AND UNDESIRED SIGNALS

(71) Applicant: GACHON UNIVERSITY OF INDUSTRY-ACADEMIC COOPERATION FOUNDATION, Gyeonggi-do (KR)

(72) Inventors: Jun Young Chung, Incheon (KR); Hyun Wook Park, Daejeon (KR)

(73) Assignee: Gachon University of Industry-Academic cooperation Foundation, Gyeonggi-Do (KR)

( * ) Notice: Subject to any disclaimer, the term of this patent is extended or adjusted under 35 U.S.C. 154(b) by 0 days.

(21) Appl. No.: 14/432,211

(22) PCT Filed: May 28, 2014

(86) PCT No.: PCT/KR2014/004765
§ 371 (c)(1),
(2) Date: Mar. 29, 2015

(87) PCT Pub. No.: WO2015/102169
PCT Pub. Date: Jul. 9, 2015

(65) Prior Publication Data
US 2016/0154081 A1  Jun. 2, 2016

(30) Foreign Application Priority Data

Dec. 30, 2013  (KR) ........................ 10-2013-0167785

(51) Int. Cl.
*G01R 33/565* (2006.01)
*G01R 33/483* (2006.01)
(Continued)

(52) U.S. Cl.
CPC ..... *G01R 33/56563* (2013.01); *G01R 33/485* (2013.01); *G01R 33/4828* (2013.01); *G01R 33/4838* (2013.01); *G01R 33/5605* (2013.01)

(58) Field of Classification Search
CPC .......... G01R 33/56563; G01R 33/4828; G01R 33/4838; G01R 33/485; G01R 33/5605
(Continued)

(56) References Cited

U.S. PATENT DOCUMENTS 5,133,357 A * 7/1992 Dumoulin ............ A61B 5/0263
324/306
5,233,298 A * 8/1993 Dumoulin ............ G01R 33/563
324/304

(Continued)

FOREIGN PATENT DOCUMENTS

CN  103167829 A  6/2013
JP  2012196432  10/2012
(Continued)

OTHER PUBLICATIONS

Juchem, Christoph, et al. "Combined passive and active shimming for in vivo MR spectroscopy at high magnetic fields." Journal of magnetic resonance 183.2 (2006): 278-289.*

(Continued)

*Primary Examiner* — Jermele M Hollington
*Assistant Examiner* — Christopher McAndrew
(74) *Attorney, Agent, or Firm* — Brooks Kushman P.C.

(57) ABSTRACT

A first off resonance radio frequency (RF) pulse and a second off resonance RF pulse having a phase difference of 180 degrees from the first off resonance RF pulse are applied, one or more auxiliary gradient magnetic fields for offsetting inhomogeneity of a main magnetic field generated by applying the first and second off resonance RF pulses are applied, and magnitudes and signs of the auxiliary gradient (Continued)

magnetic fields are appropriately adjusted. Therefore, artifacts generated due to inhomogeneity of a main magnetic field in an imaging method using an off resonance RF pulse may be removed. When this method is applied to an imaging method using a spatial pre-saturation RF pulse, the phenomenon in which spins excited by the pre-saturation RF pulse are excited again by the off resonance RF pulse to return signals, such that undesired signals overlap and appear in an ultimately-obtained signal, may be removed.

7 Claims, 11 Drawing Sheets

(51) Int. Cl.
    *G01R 33/56*     (2006.01)
    *G01R 33/48*     (2006.01)
    *G01R 33/485*    (2006.01)

(58) Field of Classification Search
    USPC .......................................................... 324/309
    See application file for complete search history.

(56) References Cited

U.S. PATENT DOCUMENTS

| | | | | |
|---|---|---|---|---|
| 5,250,898 | A * | 10/1993 | Hu | G01R 33/483 324/307 |
| 5,560,360 | A * | 10/1996 | Filler | G01R 33/56341 324/307 |
| 6,043,656 | A * | 3/2000 | Ma | G01R 33/56518 324/309 |
| 6,384,601 | B1 * | 5/2002 | Wiesler | G01R 33/4838 324/309 |
| 6,445,184 | B1 * | 9/2002 | Tanttu | G01R 33/56341 324/307 |
| 8,198,891 | B2 * | 6/2012 | Sacolick | A61B 5/055 324/307 |
| 8,248,070 | B1 | 8/2012 | Wheaton | |
| 8,278,925 | B2 * | 10/2012 | Sun | G01R 33/4828 324/307 |
| 2003/0216636 | A1 * | 11/2003 | Paley | G01R 33/445 600/410 |
| 2006/0164082 | A1 | 7/2006 | Foxall et al. | |
| 2009/0009168 | A1 * | 1/2009 | Witschey | G01R 33/56563 324/307 |
| 2009/0143672 | A1 * | 6/2009 | Harms | A61B 5/055 600/426 |
| 2010/0142784 | A1 * | 6/2010 | Yarnykh | G01R 33/4608 382/131 |
| 2010/0148774 | A1 * | 6/2010 | Kamata | G01R 33/243 324/309 |
| 2010/0194388 | A1 | 8/2010 | Kitane et al. | |
| 2010/0239142 | A1 * | 9/2010 | Dannels | G01R 33/246 382/131 |
| 2010/0239151 | A1 * | 9/2010 | Dannels | G01R 33/243 382/131 |
| 2010/0303320 | A1 | 12/2010 | Roemer et al. | |
| 2010/0315084 | A1 * | 12/2010 | Sacolick | G01R 33/583 324/309 |
| 2014/0117987 | A1 * | 5/2014 | Yui | G01R 33/28 324/309 |

FOREIGN PATENT DOCUMENTS

| | | |
|---|---|---|
| JP | 2012-522573 A | 12/2012 |
| JP | 2013085557 | 5/2013 |

OTHER PUBLICATIONS

International Search Report for PCT/KR2014/004765, completed by the Korean Patent Office on Sep. 26, 2014, 3 Pages.
"Investigation of CHESS technique", Seminar talk, Jun Young Chung, 29 pages, published on Nov. 29, 2013.
Gao, 3rd Edition MRI application ease, Mejikaru, Inc. View Company Sep. 20, 2013, 5 pages all together with English translation, "MSDE—motion sensitized driven equilibrium".
Japanese Office Action for Japanese Application No. JP 2015-555940, English Translation Attached to Original, Dated Apr. 12, 2016, All together 4 Pages.

* cited by examiner

MAGNETIC RESONANCE IMAGING METHOD CANCELING ARTIFACTS AND UNDESIRED SIGNALS

CROSS-REFERENCE TO RELATED APPLICATION

This application is the U.S. national phase of PCT Application No. PCT/KR2014/004765 filed on May 28, 2014, which claims priority to KR Patent Application No. 10-2013-0167785 filed on Dec. 30, 2013, the disclosures of which are incorporated in their entirety by reference herein.

STATEMENT REGARDING GOVERNMENT RIGHTS

This research was partly supported by a grant of the Korea Health Technology R&D Project through the Korea Health Industry Development Institute (KHIDI), funded by the Ministry of Health & Welfare, Republic of Korea (grant number: HI14C1135) and the National Research Foundation of Korea (NRF) Grant funded by Korea Government (MSIP) (no. NRF-2014M3C7033998).

TECHNICAL FIELD

The present invention relates to an imaging method implemented in a magnetic resonance imaging (MRI) system, and more particularly, to an imaging method that is capable of canceling artifacts generated by being sensitive to the inhomogeneity of a main magnetic field and is capable of canceling undesired signals generated by an off resonance RF pulse in the case of simultaneously using the off resonance RF pulse and a spatial pre-saturation RF pulse in fat saturation (suppression), magnetization transfer, and chemical exchange saturation transfer methods using the off resonance radio frequency (RF) pulse in an MRI system.

BACKGROUND ART

There are various types of image diagnosis devices such as an X-ray device, a computed tomography (CT) device, an ultrasonic device, an RI image device, an MRI device, and the like. Among them, the MRI device is a very important measuring device in a clinical practice since it is not harmful to the human body, as compared with other image diagnosis devices, and images characteristics of structural materials in the human body.

The MRI device may obtain tissue parameters such as spin density, T1, T2, a chemical shift, magnetization transfer, chemical exchange saturation transfer, hematocele, spectroscopy, and the like, which are unique information on a living body, and may obtain various biological images through these parameters. However, it is quite difficult for the MRI device to obtain images with fat and water accurately separated from each other since the fat and the water co-exist in living body tissue. The fat and the water cause relaxation time differences of T1 and T2, and artifacts are generated due to an inappropriate contrast or a chemical shift in the existing MRI imaging method depending on sensitivity of an MRI signal. Particularly, since a chemical shift phenomenon is present due to fat and water components, a detailed anatomical form cannot be obtained of a marginal zone in a structure enclosed by the fat.

In order to solve this problem, a method of selectively exciting the fat and the water using a frequency selective radio frequency (RF) pulse is most generally used.

FIGS. 1 and 2 are views describing a principle of a fat saturation (suppression) method using an off resonance RF pulse.

A unit of a chemical shift is represented by ppm (parts per million) and is measured as a relative numeral value. Since a water molecule has a chemical shift of 4.7 ppm and the fat molecule has a chemical shift of 1.2 ppm, the water molecule and the fat molecule have a difference of 3.5 ppm (See FIG. 1). In this case, when an external magnetic field is 1.5 Tesla (a resonance frequency 64 MHz), a frequency difference of 220 MHz corresponding to f=(64 MHz)*(3.5 ppm) occurs. That is, 1H of the water molecule has a larger chemical shift and undergoes a minimum effective magnetic field larger than that of 1H of the fat molecule, such that it has a high frequency.

A chemical shift selective imaging sequence (CHESS) method is a method of unilaterally suppressing a signal of any specific frequency using the RF pulse. Since the RF pulse used in this method has only the specific frequency of a measurement tissue, the frequency RF pulse is given to selectively excite only the water or fat, thereby allowing a signal having only one component to be obtained.

The CHESS method of selectively applying a saturation RF pulse that is in accordance with the resonance frequency of the fat will be described with reference to FIG. 2. When magnetization of the water or the fat is selectively excited to be put on an X-Y plane, a spoiler gradient is applied to disperse an X-Y component of the magnetization of the fat, thereby canceling the magnetization signal of the fat effectively. Since the next imaging RF pulse has an influence on only the magnetization signal of the water, only the magnetization signal of the water is generated in the obtained image.

FIG. 3 shows a preparation pulse sequence generally used in a fat suppression method. As shown in FIG. 3, an RF pulse 310 of a very small frequency band is applied in order to selectively excite the fat, and a rewinder 320 and a spoiler 330 gradients are used in order for phase recovery and fat magnetization dispersion.

However, in the fat suppression method, the degree of fat suppression may appear differently due to inhomogeneity of a main magnetic field (BO) at a local portion, and inhomogeneous fat saturation may be caused at the time of performing a test in a zone that is out of the center of the main magnetic field.

A Dixon method is used as another solution, which is a method of suppressing the fat by obtaining two different images using a phase by a processional motion frequency difference between the water and the fat molecules and performing addition and subtraction on the two images, and requires a long period of time due to a post-processing process of reconfiguring the two images. In addition, also in this method, the degree of fat suppression appears differently due to the inhomogeneity of the main magnetic field. Therefore, existing fat saturation methods have a large limitation in obtaining a homogenous image.

A basic principle of an iterative decomposition of water and fat with the echo asymmetry and least squares estimation (IDEAL) method is to mainly separate signals from each other by the phase difference between fat and water signals. In this method, which converts the 2-point Dixon method that has been conventionally used into a 3-point method, the respective echoes in three different phases (water-fat phase shifts $-\pi/6$, $\pi/2$, and $7\pi/6$) is obtained using a phase difference depending on a difference in a resonance frequency between the fat and the water, and the fat signal and the water signal are separated from each other by a reconfiguration algorithm based on the echoes to generate independent water and fat suppression images. That is, the respective echoes are obtained in three different phases per time echo (TE), and four images such as a water-only image, a fat-only image, an in-phase image, and an out-of-phase image are reconfigured by the reconfiguration algorithm based on the respective echoes. In the IDEAL method, the images are reconfigured based on the signals obtained by performing excitation three times, such that a signal-to-noise ratio is increased. However, in the IDEAL method, test time and reconfiguration time of the images are higher, compared with the existing fat saturation method. Further, since the IDEAL method is also based on the Dixon method, the degree of fat suppression in each region of the human body appears differently due to the inhomogeneity of the main magnetic field.

Magnetization transfer (MT) refers to the transfer of longitudinal magnetization from the hydrogen nuclei of water that has restricted motion to the hydrogen nuclei of water that moves with many degrees of freedom. The water with restricted motion is generally conceived as being bound to macromolecules through a series of hydrogen bonds. Saturated bound spins are excited using the off resonance RF pulse having a small frequency band so as to exchange energy by an interaction with free water spins. An effect of the magnetization transfer may be used to distinguish the articular cartilage, an adjacent joint liquid, synovia in which an inflammation is present, and the like. A physical model for the magnetization transfer as described above may be evaluated as a technical development using an advantage of a magnetization transfer contrast (MTC) image. The magnetization transfer contrast (MTC) image is an image with an increased contrast obtained by radiating the off resonance RF pulse having a continuous wave motion to saturate the resonance RF pulse in a partially restricted pool (See FIG. 4).

FIG. 5 shows examples of an RF pulse and gradient magnetic fields generally used in magnetization transfer. An off resonance RF pulse 510 having a small frequency band and spoiler gradients 530 are used, and charges of the spoiler gradients 530, magnitudes of the spoiler gradients 530, and axes on which the spoiler gradients 530 are applied are determined by an experimental value. However, generally, the influence of the spoiler gradient in imaging methods used in the magnetization transfer is not significant.

Since the off resonance RF pulse is also used in the magnetization transfer method, a post-processing process for artifacts generated due to the inhomogeneity of the main magnetic field is required.

A new technology known as chemical exchange saturation transfer (CEST) may provide a significant new tool for MR molecular imaging. CEST exploits the ability of Nuclear Magnetic Resonance (NMR) to resolve different signals arising from protons on different molecules. By selectively saturating a particular proton signal (associated with a particular molecule or CEST agent) that is in exchange with surrounding water molecules, the MRI signal from the surrounding bulk water molecules is also attenuated. Images obtained with and without the RF saturating pulse reveal the location of the CEST agent. The chemical exchange must be in the intermediate regime where exchange is fast enough to efficiently saturate the bulk water signal but slow enough that there is a chemical shift difference between the exchangeable proton and the water proton resonances. The magnitude of the CEST effect therefore depends on both the exchange rate and the number of exchangeable protons.

The CEST method has advantages over traditional molecular imaging techniques. The image contrast is controlled with radio-frequency (RF) pulses and can be turned on/off at will. The endogenous molecules of interest, in some cases, can be directly detected, eliminating the need for contrast agent to be delivered to, and to specifically react with, the molecule of interest.

Referring to FIG. 6, it may be seen that the magnetization transfer imaging method is used twice in the CEST imaging method. Two off resonance RF pulses having a small frequency band are used in frequencies having opposite signs to obtain the signals. The saturated bound spins are excited in the respective frequencies to exchange energy by an interaction with free water spins, and the chemical transfer amount can be calculated based on the ratio between these signals.

In the CEST method, as shown in FIG. 7, an RF pulse 710 and spoiler gradients 730 are used, and signs of the spoiler gradients 730, magnitudes of the spoiler gradients 730, and the axes on which the spoiler gradients 730 are used are determined by an experimental value. However, generally, the influence of the spoiler gradient used in the CEST method is not significant, similarly to the influence of the spoiler gradient in the imaging method used in the magnetization transfer.

In addition, since the magnetization transfer method is used in the CEST method, the off resonance RF pulse should be used. When the off resonance RF pulse is used, the post-processing process of canceling artifacts generated due to the inhomogeneity of the main magnetic field is required.

FIG. 8 shows a pulse sequence used in an imaging method using an off-resonance RF pulse and a pre-saturation RF pulse.

In this imaging method, as shown in FIG. 8, the pre-saturation RF pulse 805 is used before the off resonance RF pulse 810 is applied. Here, since spins excited by the pre-saturation RF pulse 805 are excited by the off resonance RF pulse 810 once again, signals are returned, such that there occurs a phenomenon wherein undesired signals overlap with the ultimately-obtained signals. This phenomenon occurs in the case in which a frequency present within a frequency bandwidth of the pre-saturation RF pulse is excited using the off resonance RF pulse.

In the fat saturation imaging method, the magnetization transfer imaging method, and the CEST imaging method, the frequency bandwidth is narrow, and the excited frequency changes depending on the frequency of the free water proton and magnitude of the main magnetic field. However, in most cases, since the frequency present in the frequency bandwidth of the pre-saturation RF pulse is excited using the off resonance RF pulse, a problem occurs due to an interference signal by the pre-saturation RF pulse.

The CEST method has advantages as compared with traditional molecule imaging technology. The image contrast can be adjusted or controlled depending on a high frequency applied from the outside. An endogenous molecule of interest may be directly detected without use of a contrast media reacting to the endogenous molecule of interest. However, since the magnetization transfer method is also used in the CEST method, the off resonance RF pulse should be used. When the off resonance RF pulse is used as described above, the post-processing process of canceling artifacts generated due to the inhomogeneity of the main magnetic field is required.

Recently, methods of implementing the CEST method using a spin-lock method have been suggested and have been used in an image emphasizing T1rho value used in muscular skeletal disease. However, since three off resonance RF pulses are used in the spin-lock method, there is a problem that the specific absorption rate (SAR) value is increased, which is a measure of the rate of energy absorption in a living body.

DISCLOSURE

Technical Problem

An aspect of the present invention provides an imaging method, capable of solving problems occurring in conventional imaging methods, by using an off resonance radio frequency (RF) pulse in order to get an image of the whole body of a human being by using a magnetic resonance imaging (MRI) system.

Another aspect of the present invention provides fat saturation (suppression), magnetization transfer, and chemical exchange saturation transfer methods that are not sensitive to the inhomogeneity of a main magnetic field.

Still another aspect of the present invention provides a method of canceling undesired signals appearing again due to an off resonance RF pulse in imaging methods simultaneously using the off resonance RF pulse and a spatial pre-saturation RF pulse.

Technical Solution

In order to solve the above-mentioned objects, a first off resonance RF pulse and a second off resonance RF pulse having a phase difference of 180 degrees from the first off resonance RF pulse are applied, and one or more auxiliary gradient magnetic fields for offsetting the inhomogeneity of a main magnetic field generated due to the application of the first and second off resonance RF pulses are added.

According to one aspect of the present invention, there is provided an MRI method through an MRI system, including: applying a first off resonance RF pulse; applying a second off resonance RF pulse for offsetting the inhomogeneity of a main magnetic field generated due to the first off resonance RF pulse; and applying one or more auxiliary gradient magnetic fields offsetting the inhomogeneity of the main magnetic field generated by applying the first and second off resonance RF pulses, wherein the application of the one or more auxiliary gradient magnetic fields includes: adjusting a combination of the one or more auxiliary gradient magnetic fields; and changing signs of the one or more auxiliary gradient magnetic fields.

In the adjusting of the combination of the one or more auxiliary gradient magnetic fields, the combination of the one or more auxiliary gradient magnetic fields may be adjusted so that the sum of the one or more auxiliary gradient magnetic fields becomes 0, and in the changing of the signs of the one or more auxiliary gradient magnetic fields, the signs of the one or more auxiliary gradient magnetic fields may be changed so that the sum of the one or more auxiliary gradient magnetic fields becomes 0.

In the changing of the signs of the one or more auxiliary gradient magnetic fields, the sign of a first auxiliary gradient magnetic field of the one or more auxiliary gradient magnetic fields may be positive (+) or negative (−).

The MRI method may further include applying spoiler gradient magnetic fields, together with the applying of the auxiliary gradient magnetic fields.

The auxiliary gradient magnetic fields may be applied at at least one of the points in time of: before the application of the first off resonance RF pulse; after the application of the first off resonance RF pulse and before the application of the second off resonance RF pulse; and after the application of the second off resonance RF pulse.

The second off resonance RF pulse may have a phase difference of 180 degrees from the first off resonance RF pulse.

The MRI method may further include, after the application of the one or more auxiliary gradient magnetic fields, applying a pulse sequence for using at least one of a fat saturation method, a magnetization transfer method, T1rho imaging method, and a chemical exchange saturation transfer method.

The MRI method may further include, before the applying of the first off resonance RF pulse, applying a spatial pre-saturation RF pulse.

Advantageous Effects

When an MRI image is obtained by the imaging method using the first and second off resonance RF pulses and the gradient magnetic fields according to an exemplary embodiment of the present invention, artifacts generated due to the inhomogeneity of a main magnetic field in an imaging method using an off resonance RF pulse may be removed. In addition, if the imaging method according to an exemplary embodiment of the present invention is applied to an imaging method using a spatial pre-saturation RF pulse, the phenomenon may be removed wherein spins excited by the pre-saturation RF pulse are again excited by the off resonance RF pulse to return signals, such that undesired signals overlap and appear in an ultimately-obtained signal.

As described above, since the artifacts generated due to the inhomogeneity of the main magnetic field may be canceled, a post-processing process is not required as in the related art, and a combination of the gradient magnetic fields rather than additional RF pulses is used in order to solve the inhomogeneity of the main magnetic field, thereby making it possible to decrease SAR values.

BEST MODE

Hereinafter, an imaging method through a magnetic resonance imaging (MRI) system according to exemplary embodiments of the present invention will be described in detail with reference to the accompanying drawings. However, a detailed description for well-known functions and configurations that may obscure the gist of the present invention will be omitted.

Since a configuration of the MRI system applied to the present invention is well-known, a description thereof will be omitted.

Generally, among imaging methods using an off resonance radio frequency (RF) pulse, there are a fat saturation (suppression) method, a magnetization transfer method, and a chemical exchange saturation transfer method. In addition, a method using a pre-saturation RF pulse capable of decreasing signals of specific positions of an image by first locally exciting spins also uses an off resonance RF pulse.

In the method as described above, artifacts are generated due to the inhomogeneity of a main magnetic field. In detail, phases of selectively excited spins are not constant due to the inhomogeneity of the main magnetic field caused by the use of the off resonance RF pulse, and signals obtained from the spins of the selected frequencies do not have the same phase due to this phase difference, such that the artifacts having an inhomogeneous form appear in a reconstructed image.

In order to solve the problem of the artifacts as described above, double off resonance RF pulses are used in the present invention.

Figure 1:
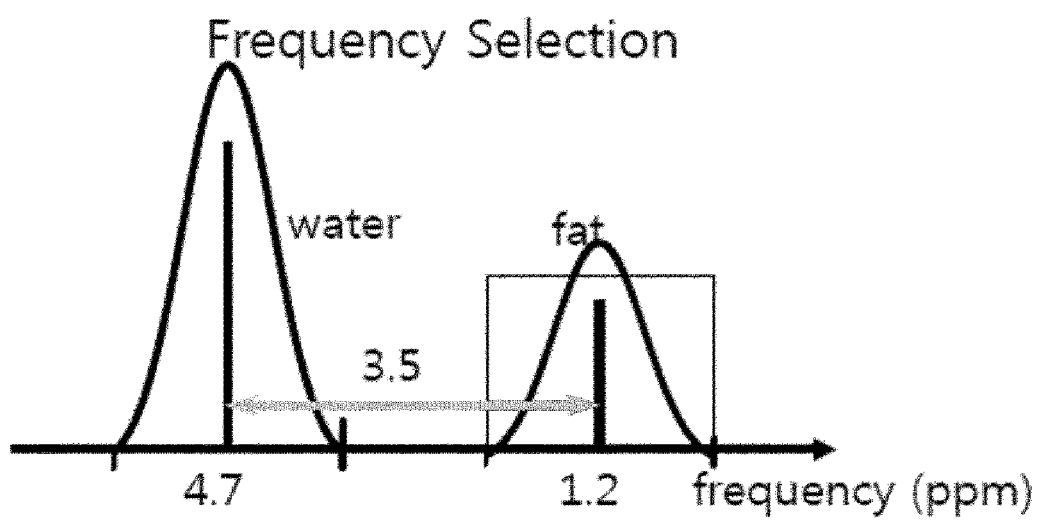
FIGS. 1 and 2 are views describing a principle of a fat saturation (suppression) method using an off resonance RF pulse.
Figure 2:
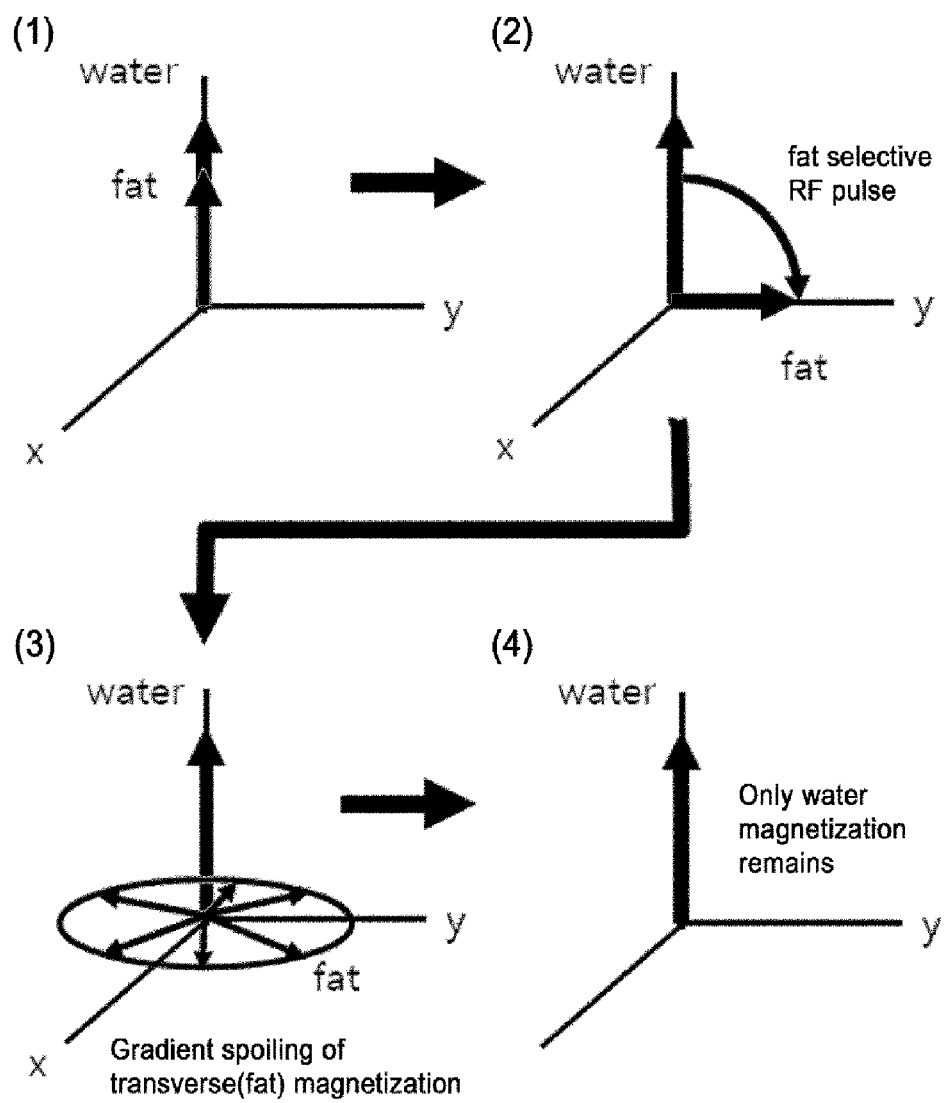
Figure 3:
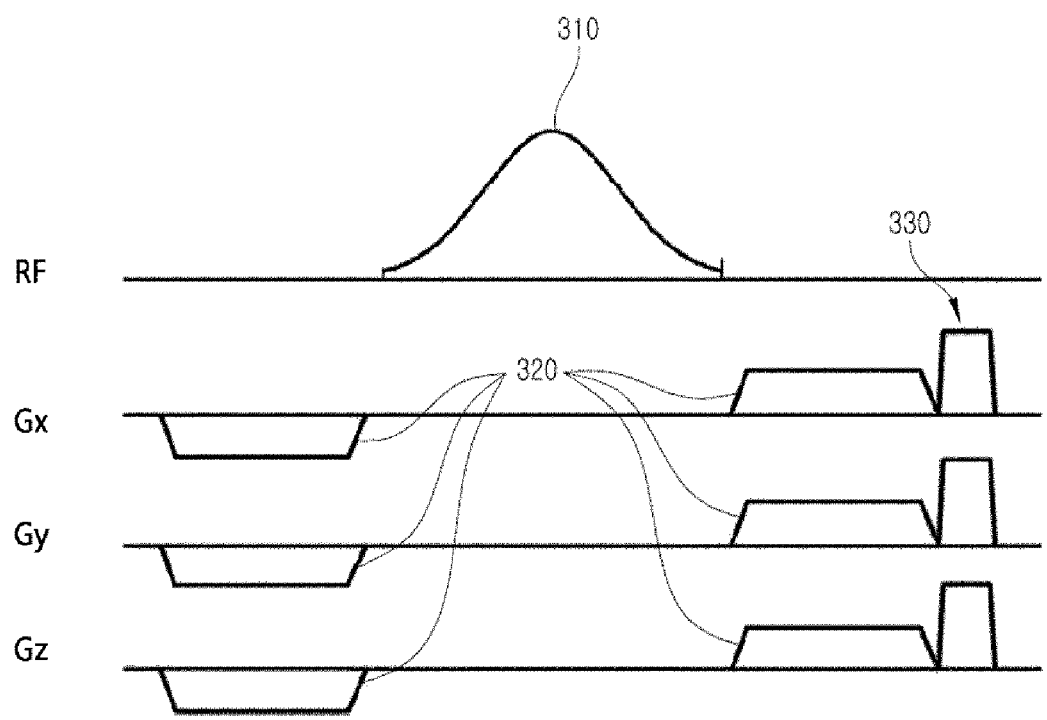
FIG. 3 shows a preparation pulse sequence generally used in a fat suppression method.
Figure 4:
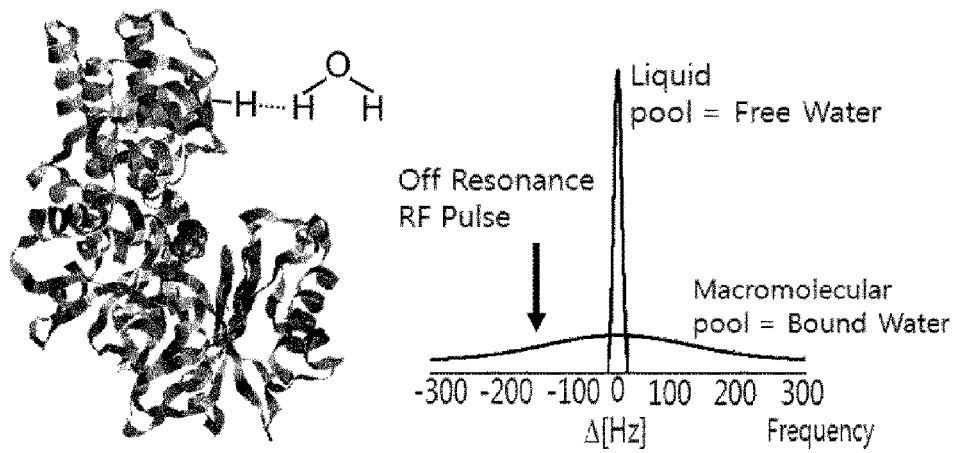
FIG. 4 is a view describing a principle of an imaging method of magnetization transfer using an off resonance RF pulse.
Figure 5:
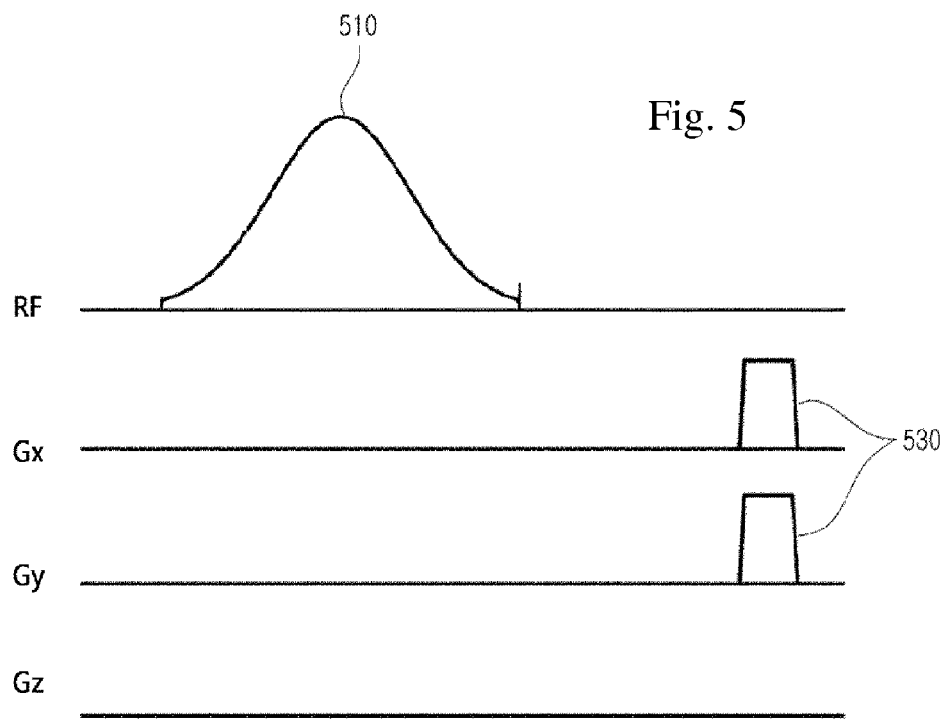
FIG. 5 shows examples of an RF pulse and a gradient magnetic field generally used in magnetization transfer.
Figure 6:
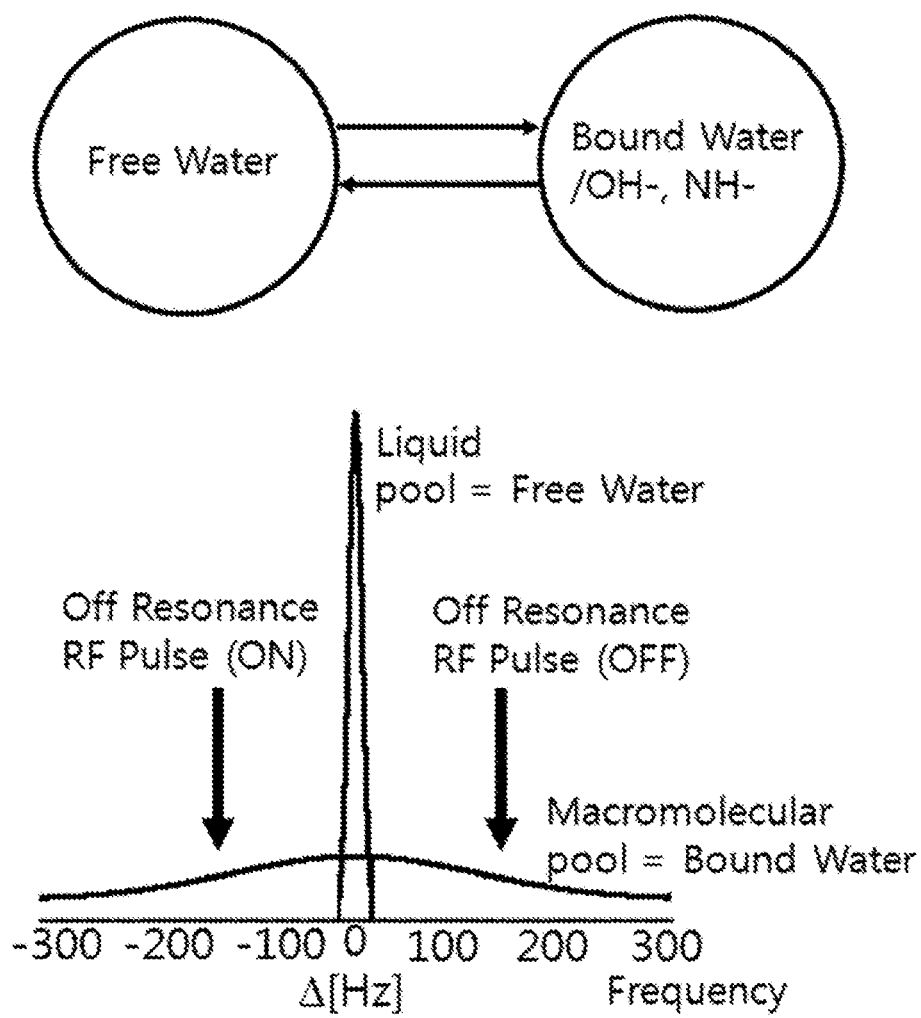
FIGS. 6 and 7 show a principle of an imaging method of chemical exchange saturation transfer using an off resonance RF pulse and examples of an RF pulse and a gradient magnetic field, respectively, that are generally used.
Figure 7:
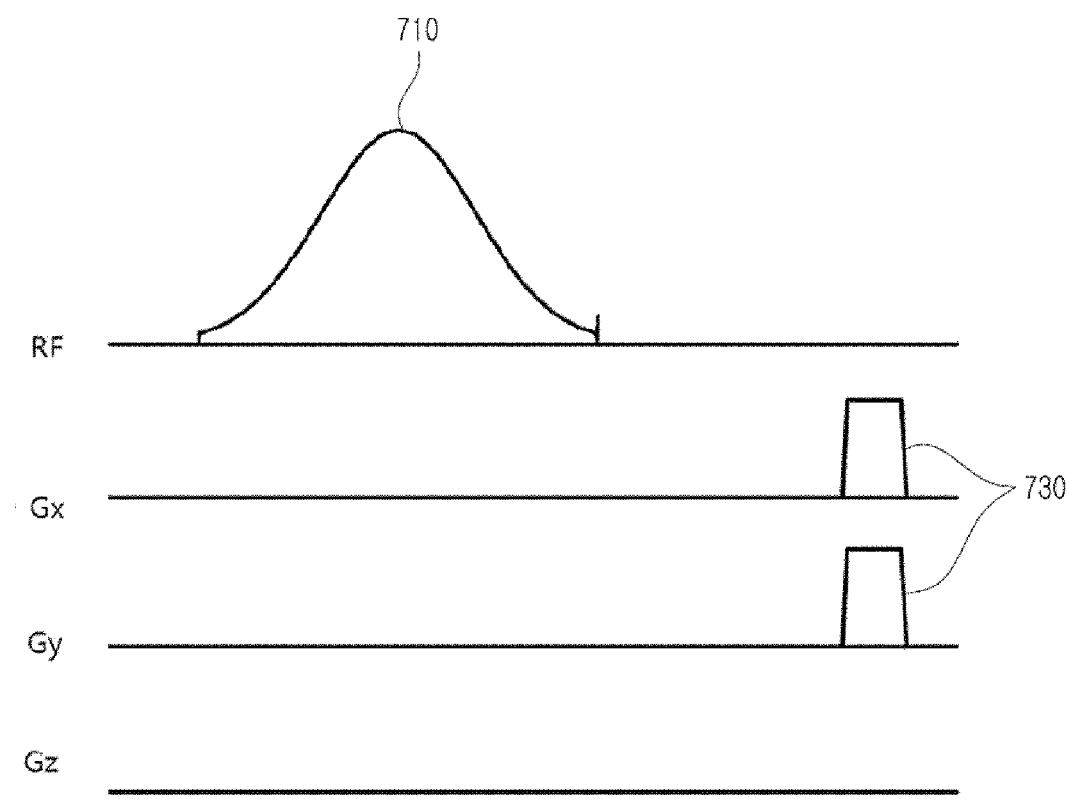
Figure 8:
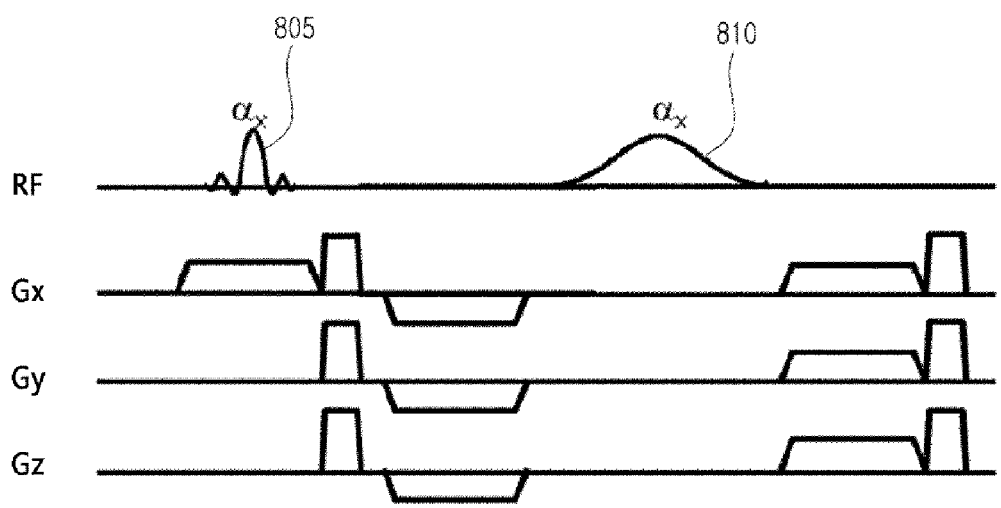
FIG. 8 shows a pulse sequence used in an imaging method using an off-resonance RF pulse and a pre-saturation RF pulse.
Figure 9:
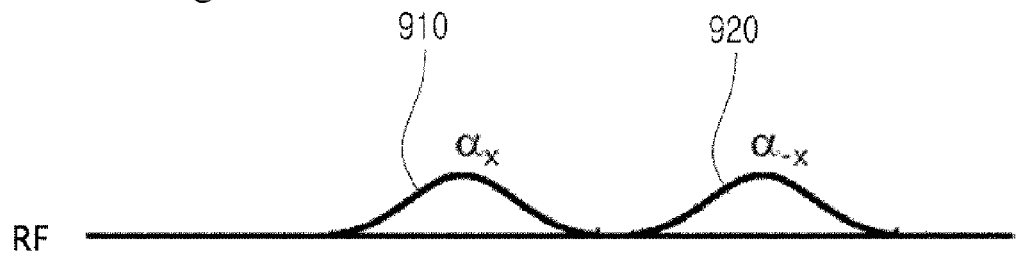
FIG. 9 is a view describing a principle of an imaging method using double off resonance RF pulses according to an exemplary embodiment of the present invention for canceling artifacts generated in general imaging methods using an off resonance RF pulse.

FIG. 9 is a view describing a principle of an imaging method using double off resonance RF pulses for canceling artifacts generated in general imaging methods using an off resonance RF pulse.

As shown in FIG. 9, after a first off resonance RF pulse 910 is applied, a second off resonance RF pulse 920 having an opposite phase, that is, a phase having a difference of 180 degrees, is applied.

In an imaging method using the off resonance RF pulse 910, since the off resonance pulse 910 is solely used without any gradient, the phase information of selectively excited spins is not constant due to the homogeneity of a main magnetic field. Due to this phase difference, signals obtained from the spins of the selected frequencies do not have the same phase, such that artifacts having an inhomogeneous form appear in a reconstructed image.

As a method of compensating for this phase difference, there is a method of applying additional gradient magnetic filed.

However, since the off resonance RF pulse 910 does not have a selective gradient magnetic field applied simultaneously therewith, and may be considered as being affected by only a small amount of gradient magnetic field due to the inhomogeneity of the main magnetic field, such a distorted phase may not be compensated for. In addition, since the off resonance pulse 910 uses a principle of selecting and exciting a frequency with respect to an entire volume without using a selective gradient magnetic field, another off resonance RF pulse 920 that is the same as the off resonance RF pulse 910 should be used in order to correct the phase. Here, the other off resonance RF pulse 920 has a phase difference of 180 degrees from the off resonance RF pulse 910 in order to return the phase distorted due to the inhomogeneity of the main magnetic field to the original phase, thereby making it possible to correct the phase.

Figure 10A:
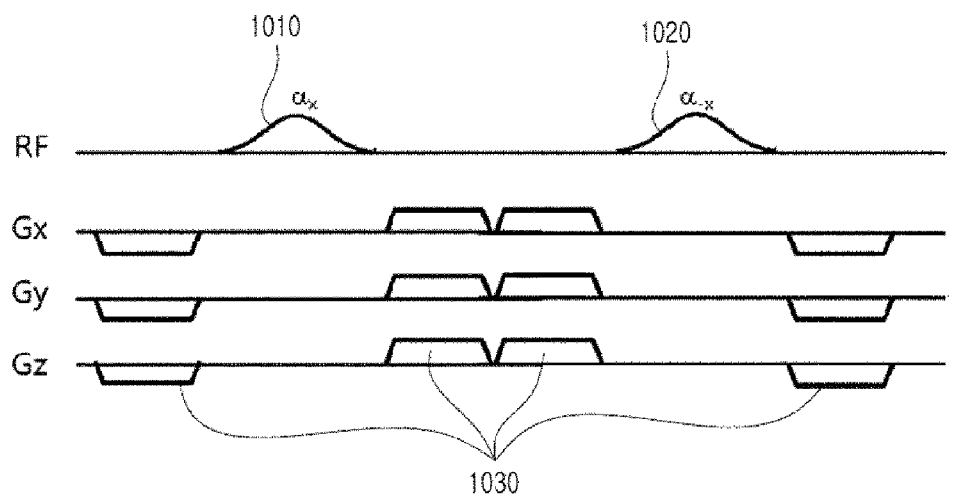
FIGS. 10a to 10c show preparation pulse sequences used in the imaging method using double off resonance RF pulses according to exemplary embodiments of the present invention, in which a combination of gradient magnetic fields are used in applying a basic principle of the double off resonance RF pulse according to an exemplary embodiment of the present invention described with reference to FIG. 9.
Figure 10B:
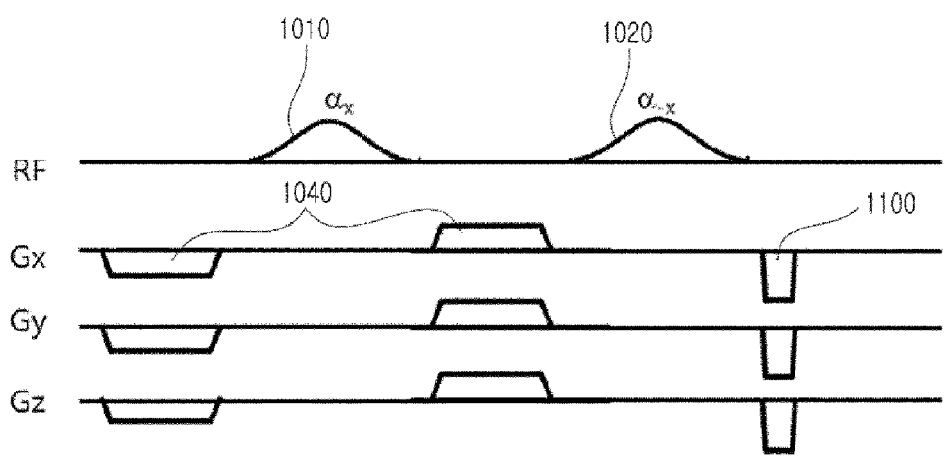
Figure 10C:
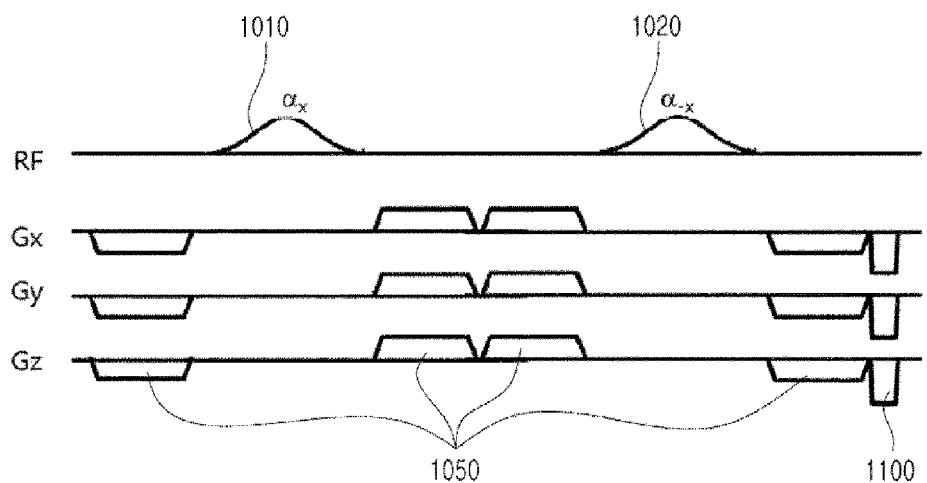

FIGS. 10a to 10c show preparation pulse sequences used in the imaging method using double off resonance RF pulses according to exemplary embodiments of the present invention, in which a combination of gradient magnetic fields are used in applying a basic principle of the double off resonance RF pulse according to an exemplary embodiment of the present invention described with reference to FIG. 9.

When two sequential RF pulses are applied, the phase is corrected by the off resonance RF pulses. However, all spins should be again magnetized longitudinally before adding imaging techniques of subsequently applying magnetic fields. As a method of canceling these residual spins, additional gradient magnetic fields are applied in an exemplary embodiment of the present invention.

In this case, unlike a method according to the related art, a combination of rewinder and spoiler gradient magnetic field is optimized, thereby making it possible to minimize the increase of time necessary for the application of double off resonance RF pulses.

That is, in the imaging method using double off resonance RF pulses according to an exemplary embodiment of the present invention, the first off resonance RF pulse is applied, the second off resonance RF pulse for offsetting the inhomogeneity of the main magnetic field generated due to the first off resonance RF pulse is applied, and one or more auxiliary gradient magnetic fields for offsetting the inhomogeneity of the main magnetic field generated by applying the first and second off resonance RF pulses are applied. Here, in applying the auxiliary gradient magnetic fields, a combination of one or more auxiliary gradient magnetic fields is adjusted and signs thereof are changed to obtain an optimal combination of auxiliary gradient magnetic fields.

As the optimal combination of the auxiliary gradient magnetic fields, the combination and the signs of the auxiliary gradient magnetic fields may be adjusted so that the sum of one or more applied auxiliary gradient magnetic fields becomes 0.

Polarities of the auxiliary gradient magnetic fields may start from a positive (+) polarity or start from a negative (−) polarity. For example, various combinations such as (+, +), (−, +, +, −), (+, 0, 0, −), (−, 0, 0, +), and the like, are possible.

Pulse sequences in the imaging method according to an exemplary embodiments of the present invention are shown in FIGS. 10a to 10c.

As shown in FIG. 10a, in a double off resonance RF pulse applying method of applying a first off resonance RF pulse 1010 and a second off resonance RF pulse 1020 having a phase difference of 180 degrees from the first off resonance RF pulse 1010, gradient magnetic fields 1030 are applied before applying the first off resonance RF pulse 1010, between the first and second off resonance RF pulses 1010 and 1020, and after the second off resonance RF pulse 1020.

The gradients 1030 may be equally applied with respect to x, y, and z axes, and values and signs thereof are adjusted so that the sum thereof becomes 0.

According to another exemplary embodiment of the present invention, as shown in FIG. 10*b*, gradients 1040 may be applied before applying the first off resonance RF pulse 1010 and between the first and second off resonance RF pulses 1010 and 1020, and spoiler gradient 1100 may be applied after applying the second resonance RF pulse 1020.

Also in this case, the gradients 1040 may be equally applied with respect to x, y, and z axes, and values and signs thereof are adjusted so that the sum thereof becomes 0.

According to still another exemplary embodiment of the present invention, as shown in FIG. 10*c*, gradients 1050 may be applied before applying the first off resonance RF pulse 1010, between the first and second off resonance RF pulses 1010 and 1020, and after applying the second off resonance RF pulse 1020, and spoiler gradient 1100 may be then applied.

Also in this case, the gradients 1050 may be equally applied with respect to x, y, and z axes, and values and signs thereof are adjusted so that the sum thereof becomes 0.

Meanwhile, frequency bandwidths, central frequencies, and pulse forms of the first and second off resonance RF pulses may be adjusted, if necessary. For example, in the case of using a fat saturation method, the width of the off resonance RF pulse is relatively large; however, in the case of using a magnetization transfer or CEST method, an off resonance RF pulse having a narrower width compared with that of the fat saturation method is used. That is, the frequency bandwidths, the central frequencies, and the pulse forms of the first and second off resonance RF pulses may be appropriately selected depending on a used imaging method, and is not particularly limited in the present invention.

Since an image without artifacts due to the inhomogeneity of the main magnetic field is obtained by using the first and second off resonance RF pulses and the combination of the gradients as described above, a post-processing process for compensating for the inhomogeneity of the main magnetic field or acquisition of an additional image for the post-processing as in the related art is not required.

In addition, the imaging method according to an exemplary embodiment of the present invention, that solves problems related to the inhomogeneity of the main magnetic field by using the combination of the gradient magnetic fields while using the first and second off resonance RF pulses, may more reliably solve problems related to the inhomogeneity of the main magnetic field and decrease the number of RF pulses as compared with a spin lock method of applying a third RF pulse, thereby making it possible to decrease a specific absorption rate (SAR) value, which is an index of a radio wave absorption rate of the living body.

Figure 11:
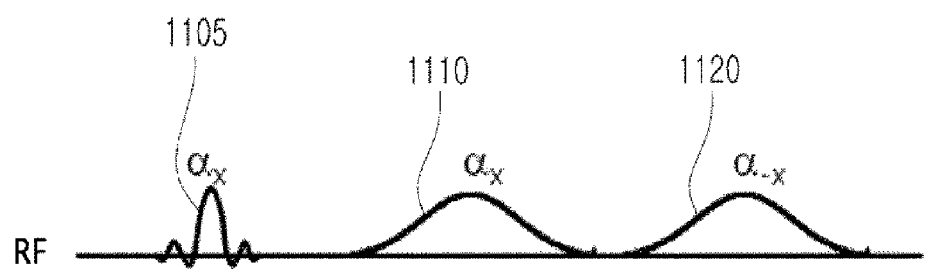
FIG. 11 is a view showing an imaging method using double off resonance RF pulses according to an exemplary embodiment of the present invention for canceling artifacts generated in general imaging methods using an off resonance RF pulse and a pre-saturation RF pulse.

FIG. 11 is a view showing an exemplary embodiment of the present invention for removing a phenomenon that spins excited by a pre-saturation RF pulse are excited once again by the off resonance RF pulse to return signals, such that undesired signals are overlapped with and appear in a finally obtained signal in general imaging methods using the off resonance RF pulse and the pre-saturation RF pulse.

As shown in FIG. 11, two off resonance RF pulses 1110 and 1120 are used together with a pre-saturation RF pulse 1105.

Here, similar to exemplary embodiments described above with reference to FIGS. 10*a* to 10*c*, appropriately combined gradient magnetic fields are applied, thereby making it possible to minimize undesired signals.

Figure 12A:
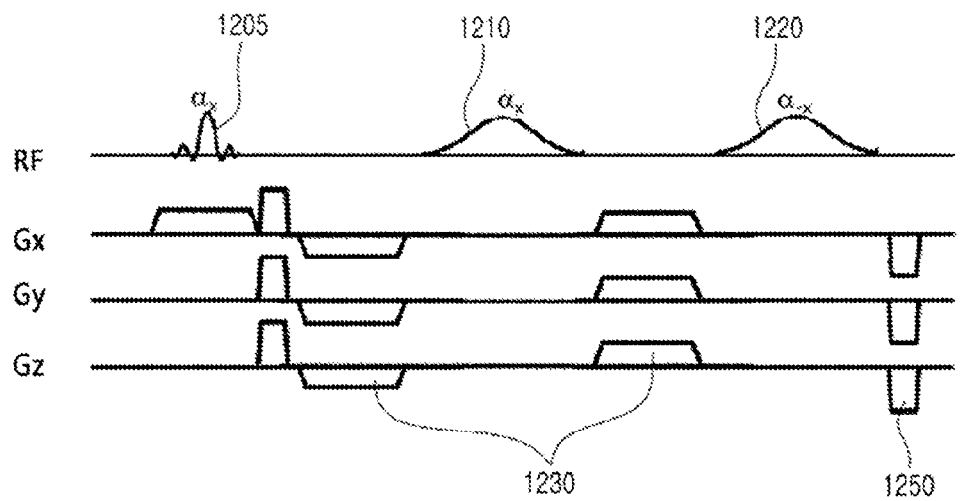
FIGS. 12a and 12b show preparation pulse sequences according to exemplary embodiments of the present invention for canceling undesired signals by applying gradient magnetic fields in an imaging method using an off resonance RF pulse and a pre-saturation RF pulse.
Figure 12B:
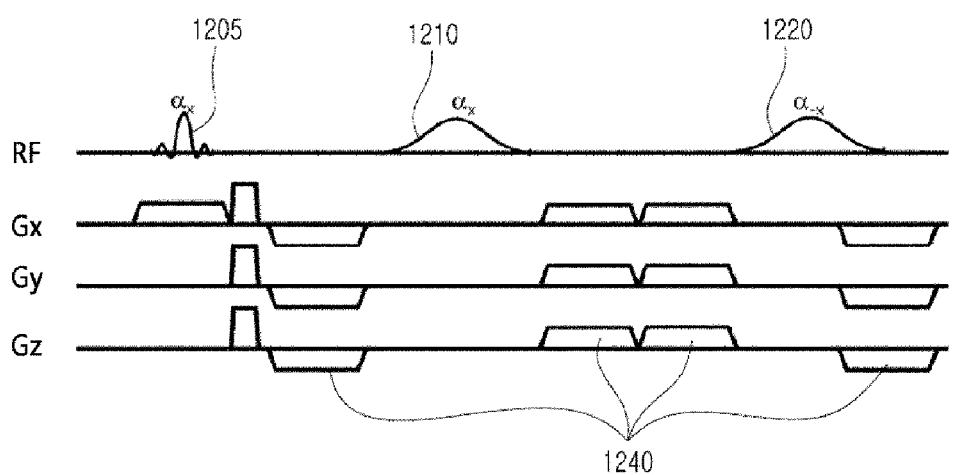

FIGS. 12*a* and 12*b* show preparation pulse sequences according to exemplary embodiments of the present invention for canceling undesired signals by applying gradient magnetic fields in an imaging method using an off resonance RF pulse and a pre-saturation RF pulse.

First, as shown in FIG. 12*a*, gradient magnetic fields 1230 are applied after applying a pre-saturation RF pulse 1205 and before applying a first off resonance RF pulse 1210 and are applied between first and second off resonance RF pulses 1210 and 1220. In addition, a spoiler gradient 110 may be applied after applying the second off resonance RF pulse 1220.

In addition, in another exemplary embodiment of the present invention shown in FIG. 12*b*, gradient magnetic fields 1240 are applied after applying a pre-saturation RF pulse 1205 and before applying a first off resonance RF pulse 1210, are applied between first and second off resonance RF pulses 1210 and 1220, and are applied after applying the second off resonance RF pulse 1220.

In both of two exemplary embodiments shown in FIGS. 12*a* and 12*b*, it is preferable that values and signs of the gradient magnetic fields are adjusted so that the sum thereof becomes 0.

Figure 13:
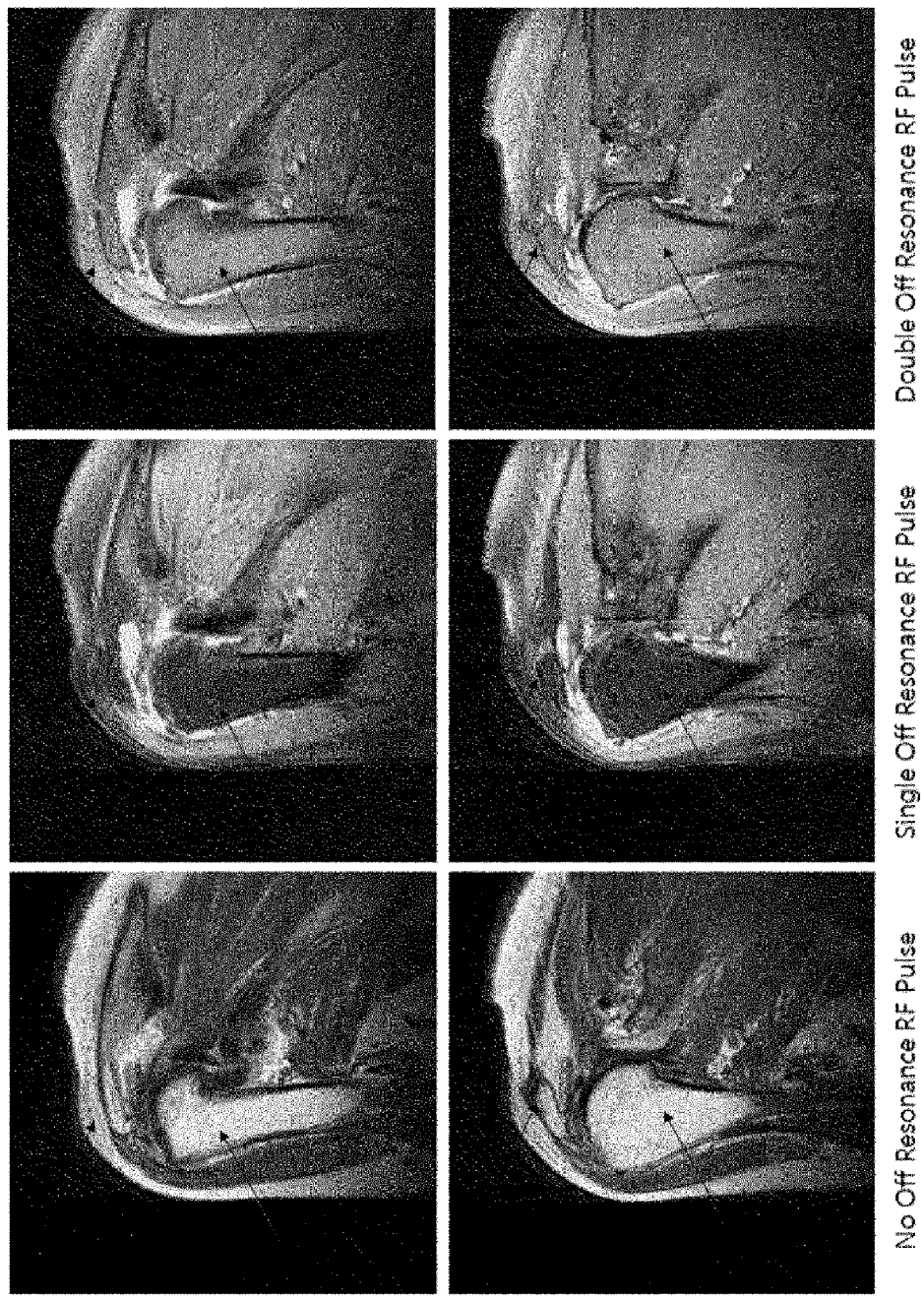
FIG. 13 shows an example in which a pulse sequence including double off resonance RF pulses and a combination of gradient magnetic fields according to an exemplary embodiment of the present invention is applied to a fat saturation imaging method of an image acquisition of a shoulder region.

FIG. 13 shows an example in which a pulse sequence including double off resonance RF pulses and a combination of gradient magnetic fields according to an exemplary embodiment of the present invention is applied to a fat saturation imaging method of an image acquisition of a shoulder region. In FIG. 13, the pulse sequence shown in FIG. 10*a* has been used.

In FIG. 13, on the left side are images obtained without fat saturation, at the center are images obtained using a single off resonance RF pulse imaging method currently clinically used, and on the right side are images obtained using double off resonance RF pulses and the combination of the gradient magnetic fields according to an exemplary embodiment of the present invention. The images obtained using a single off resonance RF pulse have a fat saturation effect greater than that of the imaging method using double off resonance RF pulses, but include artifacts generated due to the inhomogeneity of the main magnetic field, as compared with those of the reference image (center).

On the other hand, it may be appreciated that the double off resonance RF pulse imaging method according to an exemplary embodiment of the present invention does not include artifacts at all and accomplishes homogeneous fat saturation, which indicates an improved result.

MRI method using double off resonance RF pulse according to the embodiments of the present invention can be applied to fat saturation method, a magnetization transfer method, T1rho imaging method, and a chemical exchange saturation transfer method.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

The invention claimed is:

1. A magnetic resonance imaging (MRI) method using an MRI system, comprising:

applying a first off resonance radio frequency (RF) pulse;

applying a second off resonance RF pulse for offsetting the inhomogeneity of a main magnetic field generated due to the first off resonance RF pulse, the second off resonance RF pulse having a phase difference of 180 degrees from the first off resonance RF pulse; and applying a plurality of auxiliary gradient magnetic fields for offsetting the inhomogeneity of the main magnetic field generated by applying the first and second off resonance RF pulses, wherein the application of the plurality of auxiliary gradient magnetic fields includes adjusting a combination of the plurality of auxiliary gradient magnetic fields, and changing signs of the plurality of auxiliary gradient magnetic fields, such that the sum of the plurality of auxiliary gradient magnetic fields becomes 0, wherein at least one auxiliary gradient magnetic field is applied before the application of the first off resonance RF pulse, and at least one auxiliary gradient magnetic field is applied between the application of the first off resonance RF pulse and the application of the second off resonance RF pulse.

2. The MRI method of claim 1, wherein in the change of the signs of the plurality of auxiliary gradient magnetic fields, the sign of a first auxiliary gradient magnetic field of the plurality of auxiliary gradient magnetic fields is positive (+).

3. The MRI method of claim 1, wherein in the change of the signs of the plurality of auxiliary gradient magnetic fields, the sign of a first auxiliary gradient magnetic field of the plurality of auxiliary gradient magnetic fields is negative (−).

4. The MRI method of claim 1, further comprising applying spoiler gradient magnetic fields.

5. The MRI method of claim 1 further comprising, after the application of the plurality of auxiliary gradient magnetic fields, applying a pulse sequence of at least one of a fat saturation method, a magnetization transfer method, T1rho imaging method, and a chemical exchange saturation transfer method.

6. The MRI method of claim 1, further comprising, before the application of the first off resonance RF pulse, applying a spatial pre-saturation RF pulse.

7. The MRI method of claim 1, wherein the least one auxiliary gradient magnetic field applied between the application of the first off resonance RF pulse and the application of the second off resonance RF pulse comprises applying two auxiliary gradient magnetic fields between the application of the first off resonance RF pulse and the application of the second off resonance RF pulse.

* * * * *